United States Patent [19]

Strong et al.

[11] 4,174,380
[45] * Nov. 13, 1979

[54] ANNEALING SYNTHETIC DIAMOND TYPE IB

[75] Inventors: Herbert M. Strong, Schenectady; Richard M. Chrenko, Scotia; Roy E. Tuft, Guilderland Center, all of N.Y.

[73] Assignee: General Electric Company, Schenectady, N.Y.

[*] Notice: The portion of the term of this patent subsequent to Nov. 7, 1995, has been disclaimed.

[21] Appl. No.: 860,283

[22] Filed: Dec. 14, 1977

Related U.S. Application Data

[63] Continuation of Ser. No. 707,298, Jul. 21, 1976, abandoned.

[51] Int. Cl.$^2$ .............................................. C01B 31/06
[52] U.S. Cl. ...................................... 423/446; 51/307
[58] Field of Search ........................... 423/446; 51/307

[56] References Cited

U.S. PATENT DOCUMENTS

| | | | |
|---|---|---|---|
| 3,141,746 | 7/1964 | DeLai | 51/307 |
| 3,574,580 | 4/1971 | Stromberg et al. | 423/446 X |
| 3,630,679 | 12/1971 | Angus | 423/446 |
| 3,819,814 | 6/1974 | Pope | 423/446 |
| 4,073,380 | 2/1978 | Strong et al. | 423/446 X |

OTHER PUBLICATIONS

Stromberg et al., "American Ceramic Bulletin", vol. 49, No. 12 (1970), pp. 1030–1032.
Angus et al., "J. Applied Physics", vol. 39, No. 6, May 1963, pp. 2915–2922.
Klyuev et al., "Sov. Phys. Solid State", vol. 16, No. 11, May 1975, pp. 2118–2121.
Jewelers' Circular Keystone, Jul. 1970, pp. 186–189.

*Primary Examiner*—Edward J. Meros
*Attorney, Agent, or Firm*—Jane M. Binkowski; Joseph T. Cohen; Leo I. MaLossi

[57] ABSTRACT

Type Ib synthetic diamond crystal is annealed at an annealing temperature ranging from about 1500° C. to about 2200° C. under a pressure which prevents significant graphitization of the diamond during the annealing to convert at least about 20% of the total amount of type Ib nitrogen present in the crystal to type Ia nitrogen.

12 Claims, 5 Drawing Figures

ANNEALING SYNTHETIC DIAMOND TYPE IB

This is a continuation of application Ser. No. 707,298, filed July 21, 1976, now abandoned.

This invention relates to the annealing of synthetic diamond type Ib to convert at least a portion of it to type Ia diamond.

Diamonds are generally classified into four main types: Ia, Ib, IIa, and IIb. These types are most easily distinguished by infrared and ultraviolet spectra and sometimes by electron paramagnetic resonance (EPR). Type Ia and Ib diamonds contain dissolved nitrogen; in Ia diamonds, most of the nitrogen is not EPR active and appears to be in aggregated form; in Ib diamonds most of the nitrogen is EPR active, and is atomically dispersed. Types IIa and IIb diamonds do not contain appreciable nitrogen. Each type of diamond has typical infrared and ultraviolet spectra with characteristic features.

The large majority of synthesized diamonds are type Ib, but type IIa diamonds can easily be made either by excluding nitrogen from the diamond growing media or by using appropriate nitrogen getters.

The large majority of natural diamonds examined are type Ia. No type Ia diamonds have been synthetized thus far in the laboratory. Natural type Ia diamond crystals can have a variety of colors, with many being pale yellow to colorless. Such a diamond crystal can also be a combination of pale yellow and colorless areas as well as exhibit local varations in its characteristic color in different parts of the crystal. Ordinarily, it has a rounded dodecahedral or octahedral morphology.

There are two forms of type Ia diamond, an A band form and a B band form, and these forms are distinguishable by their infrared, visible and ultraviolet absorption spectra. Usually, however, these two forms are most easily differentiated by their infrared spectra wherein the A band form has its main absorption band coming at 1280 cm$^{-1}$ and the B band form has its main absorption band coming at 1175 cm$^{-1}$. While each form of type Ia appears to be thermodynamically more stable than type Ib diamond, the present process has thus far produced only the A band form which is hereinafter referred to broadly as type Ia.

Synthetic diamonds are substantially the same as natural diamonds but there are enough differences between them to distinguish between the natural and synthetic crystals. These differences are mainly in morphology, surface appearance, impurity inclusions and the nature of impurity imperfections such as the different forms of nitrogen. As found, natural diamond crystals most frequently have curved edges and convex faces. On the other hand, synthesized diamond crystals, as grown, have sharp edges, flat and relatively smooth faces. Depending on the conditions of growth, synthetic type Ib crystals have octahedral or cubo-octahedral morphology, the latter sometimes having small (113) faces. Also, depending on the conditions of growth, a synthetic type Ib crystal may have no definite morphology and can have a wide variety of shapes with some substantially distorted from the octahedral or cubo-octahedral regular shapes, as well as in extreme cases, highly irregular particles of no particular shape. Impurity inclusions in synthetic diamonds are metal catalysts whereas in natural diamonds they are a variety of minerals, and these impurity inclusions are detectable by several techniques such as electron diffraction analysis or X-ray analysis.

Those skilled in the art will gain a further and better understanding of the present invention from the detailed description set forth below, considered in conjunction with the figures accompanying and forming a part of the specification in which.

Figure 1:
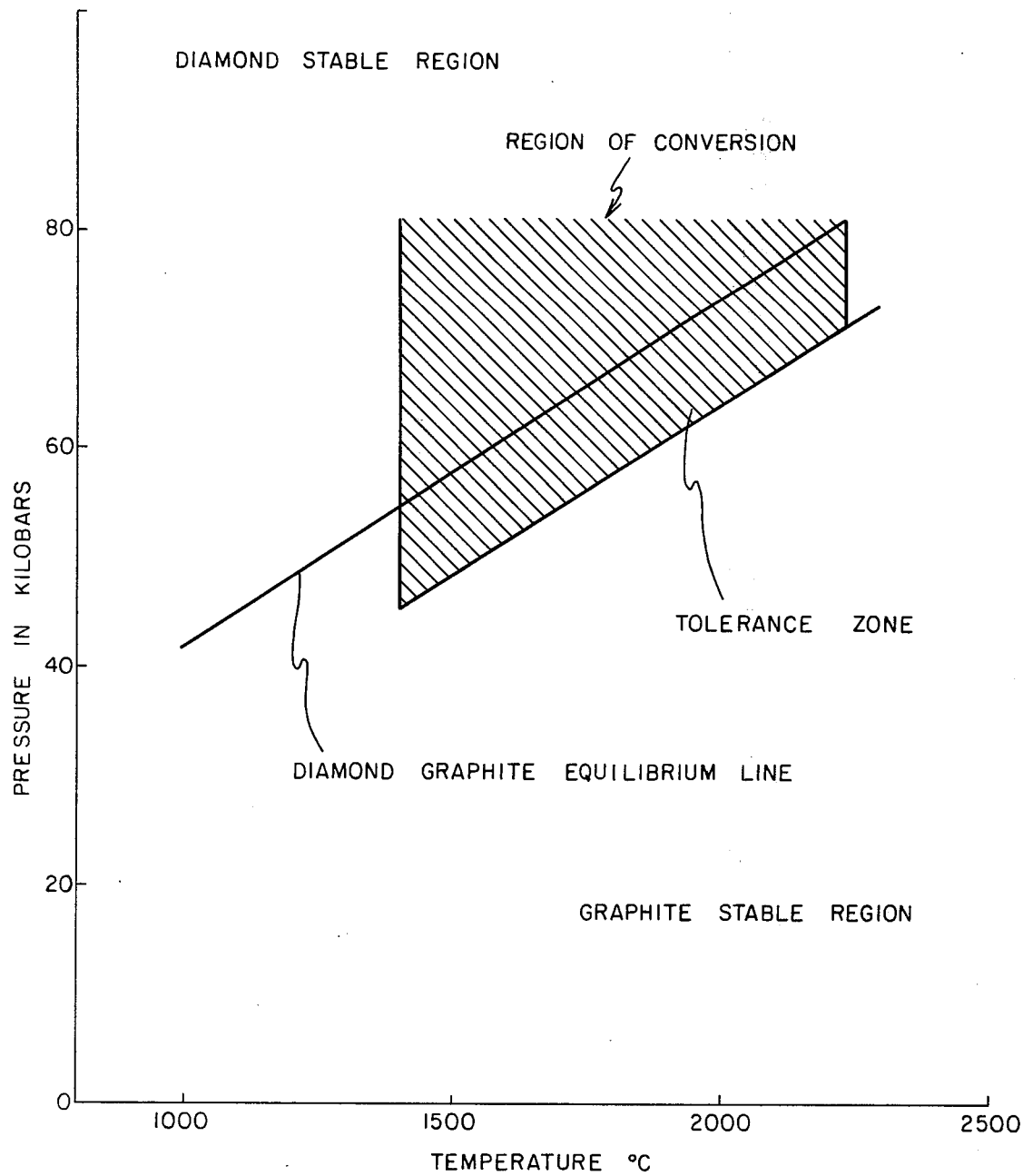
FIG. 1 represents the phase diagram of carbon showing the diamond-graphite equilibrium line and the shaded area defines the Region of Conversion which encompasses the required annealing temperatures and the corresponding annealing pressures of the present process.

According to the present process, type Ib synthetic diamond is converted to type Ia. Briefly stated, the present process comprises annealing type Ib synthetic diamond crystal at an annealing temperature ranging from about 1500° C. to about 2200° C. under a pressure which prevents significant graphitization of the diamond during annealing to convert at least about 20% of the total amount of type Ib nitrogen present in the crystal to type Ia nitrogen.

In the present process the amount of conversion of type Ib nitrogen to type Ia nitrogen is determinable by a number of conventional techniques. The most frequently used technique is one where it is revealed by the differences or changes in the absorption spectra of the Ib crystal taken before and after annealing. Specifically, spectra are taken of the type Ib crystal at room temperature by means of spectrometers in a conventional manner showing the ultraviolet, visible and infrared absorption spectra of the crystal. After the crystal is annealed, spectra are taken of it again at room temperature showing its ultraviolet, visible and infrared absorption spectra. From a comparison of the changes in these spectra, the amount of conversion of type Ib nitrogen to type Ia nitrogen, i.e. the percent of the total amount of type Ib nitrogen present in the crystal converted to type Ia nitrogen, is determinable in a conventional manner.

Synthetic type Ib diamond crystal has a color depending on the amount of nitrogen dissolved in the crystal. The color of the crystal ranges from a green to a greenish-yellow to a yellow with the maximum or largest amount of dissolved nitrogen producing the greenish-yellow color. Likewise, the amount of nitrogen dissolved in the crystal determines the intensity of the yellow color which can range from a deep golden yellow to a pale yellow with the deep golden yellow indicating substantially more dissolved nitrogen than the pale yellow. In addition, the Ib diamond crystal can exhibit a mixture of greenish-yellow and/or yellow colors or shades, i.e. it can exhibit local variations in its characteristic color and intensity, which indicates regions of varying nitrogen content.

In the present process there is no limitation on the size of the type Ib diamond crystal. Specifically, the minimum size of the crystal can be one micron or less and the maximum size is limited only by the capacity of the annealing equipment. For most present applications, the Ib crystal size ranges from about 0.25 millimeter to about 6 millimeters. The size of the diamond crystal given herein is that measured along the longest edge dimension of the crystal.

The present annealing process is carried out in high temperature-high pressure apparatus normally used for synthesizing diamonds by application of high temperatures and pressures to a suitable reaction mass or specimen.

One preferred form of a high pressure-high temperature apparatus in which the present invention can be carried out is disclosed by U.S. Pat. No. 2,941,248—Hall which, by reference, is incorporated herein, and it is also disclosed in numerous other patents and publications. Those skilled in the art are well acquainted with this "belt-type" apparatus and, for this reason, the apparatus is not illustrated. Essentially, the apparatus consists of a pair of cemented tungsten carbide punches disposed to either side of an intermediate belt or die member of the same material. The space between the two punches and the die is occupied by the reaction vessel and surrounding gasket/insulation assemblies therefor. High pressures are generated in the reaction vessel from the compressive forces caused by the relative movement of the co-axially disposed punches toward each other within the die. Means are provided for heating the reaction mass in the reaction vessel during the application of pressure.

There are, of course, various other apparatuses capable of providing the required pressures and temperatures that can be employed within the scope of this invention such as tetrahedral types, cubic types and spherical types. Operational techniques for applying high pressures and temperatures in the apparatuses useful in the present process are well known to those skilled in the super-pressure art.

Various reaction vessel configurations which provide for indirect or direct heating of the reaction mass are disclosed in the patent literature and are useful in carrying out the present annealing process. These reaction vessels usually consist of a plurality of interfitting cylindrical members and end plugs or discs for containing the reaction mass in the centermost cylinder. In the indirectly heated type of reaction vessel one of the cylindrical members is made of graphite which is heated by the passage of electric current therethrough and which thereby heats the reaction mass. In the directly heated type of reaction vessel, the reaction mass is electrically conductive, thereby eliminating the need for an electrically conductive graphite cylinder, and electric current is passed directly through the reaction mass to heat it.

U.S. Pat. No. 2,941,248—Hall discloses an embodiment of a reaction vessel wherein the reaction specimen is indirectly heated, as well as the alternative embodiment for directly heating the reaction specimen when it is electrically conductive.

U.S. Pat. No. 3,031,269—Bovenkerk which, by reference, is incorporated herein, discloses a reaction vessel for indirect heating of the reaction mass. Specifically, the outer element of the reaction vessel is a hollow pyrophyllite cylinder, positioned concentrically within and adjacent to the pyrophyllite cylinder is a graphite electrical resistance heater tube, and within the graphite tube there is concentrically positioned an alumina cylinder which holds the reaction mass or specimen.

Figure 2:
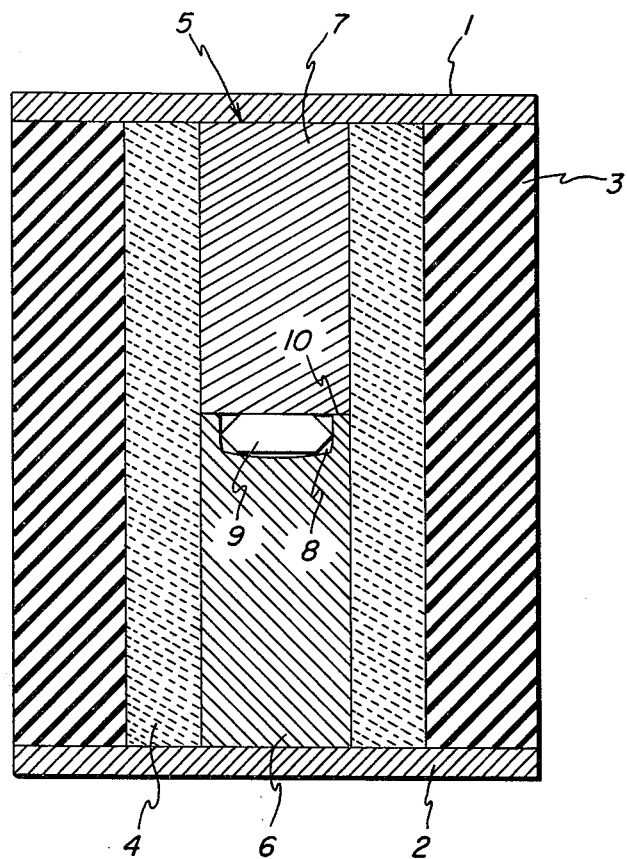
FIG. 2 is a sectional view of a preferred reaction vessel for carrying out the present invention.
Figure 3:
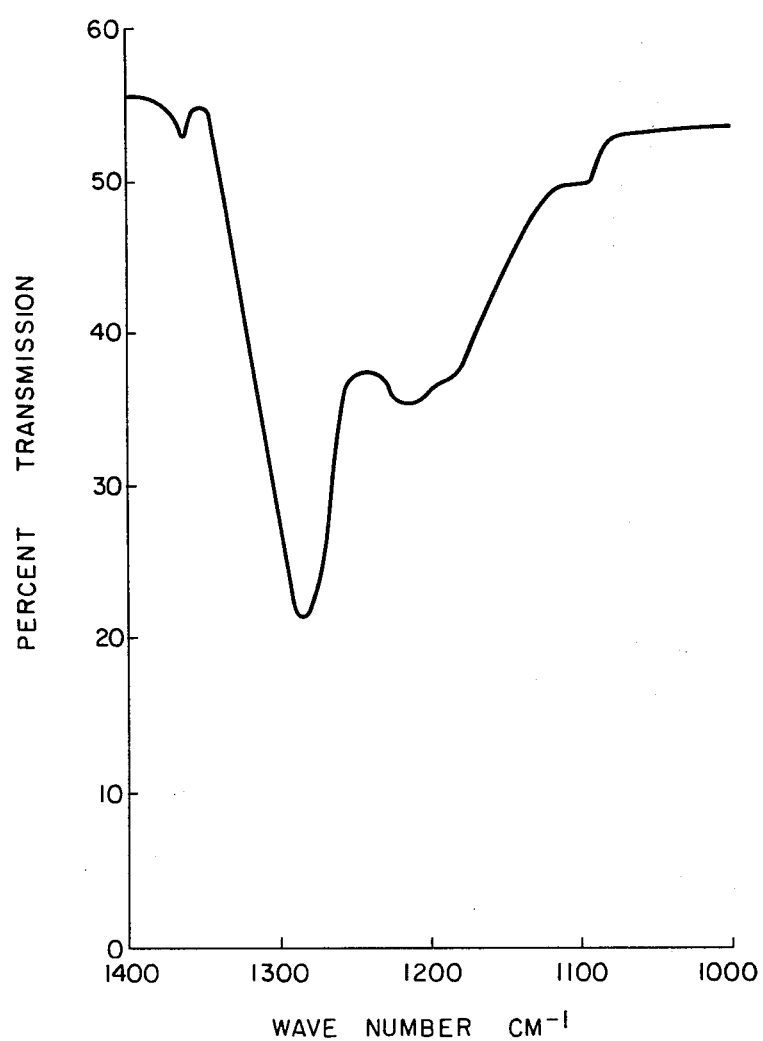
FIG. 3 shows a typical infrared absorption spectrum of the region of interest for a type Ia natural diamond crystal.
Figure 4:
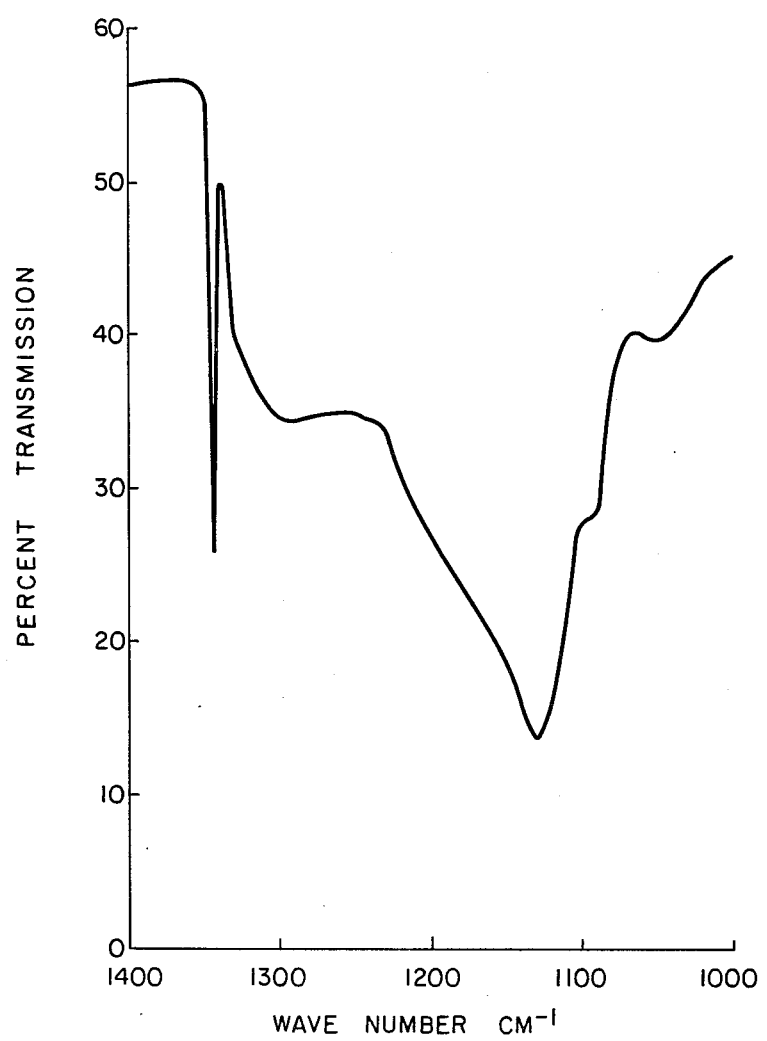
FIG. 4 shows a typical infrared absorption spectrum of the region of interest for a synthetic type Ib diamond crystal.
Figure 5:
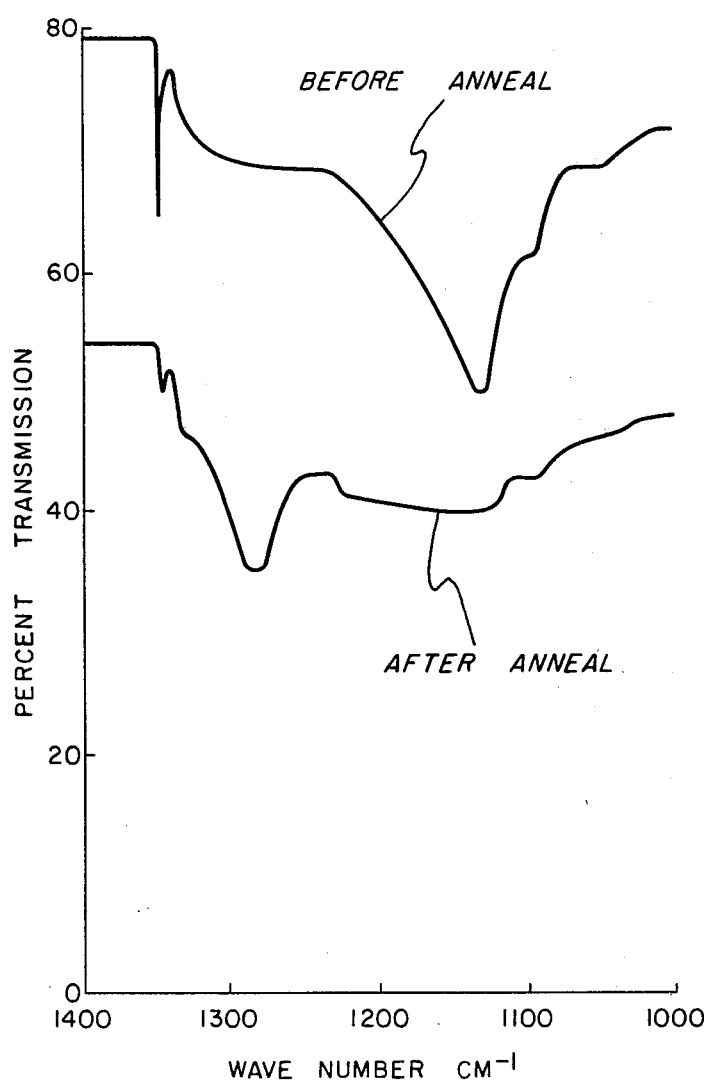
FIG. 5 shows infrared absorption spectra of the region of interest of a synthetic type Ib crystal taken before and after it was annealed in accordance with the present process showing that the annealing resulted in a conversion significantly higher than 20% of type Ib nitrogen to type Ia nitrogen.

The directly heated embodiment of the reaction vessel is preferred in the present process, and a particularly preferred form is shown in FIG. 2. Specifically, this reaction vessel includes a hollow outer cylinder 3 made of non-conducting material such as pyrophyllite. Positioned concentrically within and adjacent pyrophllite cylinder 3 is ceramic cylinder 4 preferably made of alumina. Charge element or insert assembly 5 is adapted to fit concentrically in ceramic cylinder 4 and is dimensioned for a close fit with cylinder 4. Charge element 5 is comprised of graphite rod 7 and graphite rod 6 wherein the graphite is of spectroscopic purity. Graphite rod 6 has hole 8 which is drilled to fit closely around diamond crystal 9, i.e., the diamond to be annealed. Diamond crystal 9 should not project outside of hole 8 since such projection would prevent a close contiguous fit of rod 7 with rod 6. Rod 7 should be in electrical contact with rod 6 at surface 10. Preferably, the top surface of diamond 9 is flush with surface 10 of graphite rod 6. Any space between diamond crystal 9 and hole 8 is preferably filled with an electrically conducting material, such as graphite powder of spectroscopic purity, to promote passage of the electric current and thereby promote heating of diamond 9. Electrically conducting circular metallic discs 1 and 2 close the ends of graphite rods 6, 7, and cylinders 3 and 4. Discs 1 and 2 are preferably made of a metal such as nickel or tantalum and must be in electrical contact with graphite rods 7 and 6, respectively. Since graphite rod 6 is electrically conducting and diamond crystal 9 is not electrically conducting, the highest temperatures are attained and maintained at the thinnest portions of graphite rod 6, e.g., the area of graphite rod 6 surrounding diamond crystal 9.

After assembly of the reaction vessel and introduction thereof into the high pressure-high temperature apparatus within the gasket/insulation assemblies preferably pressure is raised first and then the temperature. The rates of increase of pressure or temperature are not critical. When pressure and temperature are at a level in the Region of Conversion defined in FIG. 1, they are held at that level for a period of time sufficient to attain the desired conversion of at least about 20% of the diamond's Ib type nitrogen to type Ia nitrogen. When the desired conversion is attained, the electrical power which heats the diamond crystal is shut off and the crystal cools to about room temperature quickly, usually in about 1 minute. Generally, when the crystal has cooled to below 50° C., the pressure is then released, preferably at a rate of about 10 kilobars per minute to atmospheric pressure.

In the present annealing process a synthetic type Ib diamond is annealed at a temperature ranging from about 1500° C. to about 2200° C. Annealing temperatures lower than about 1500° C. are not operable or take too long a period of annealing time to be practical. Annealing temperatures higher than 2200° C. provide no significant advantage. Annealing temperatures ranging from 1600° C. to 2000° C. are preferred since they are not too difficult to attain, do not require excessively high pressures and since they induce high rates of conversion.

The pressure used in the present process need only be sufficient to maintain the diamond stable at the annealing temperature. Specifically, it is a pressure which prevents graphitization or prevents significant graphitization of the diamond crystal at the annealing temperature. The shaded area of FIG. 1 defines the Region of Conversion which defines the operable temperatures and corresponding annealing operable pressures of the present process. The diamond-graphite equilibrium line as well as pressure and temperature calibrations at such superpressures are not definitely known. The diamond-graphite equilibrium line shown in FIG. 1 is the best approximation known at present for diamond-graphite equilibrium. Preferably, the present process is carried out at or above this diamond-graphite equilibrium line. The shaded area in FIG. 1 of the Region of Conversion below the diamond-graphite equilibrium line is a tolerance zone which shows the lower pressures which are operable in the present process for limited periods of time. For example, for the minimum pressures shown by the tolerance zone, the maximum period of annealing time is about one hour without significant graphitization of the diamond crystal occurring. If annealing times longer than one hour are used, then the pressure applied in the tolerance zone should be closer to the diamond-graphite equilibrium line.

As shown in FIG. 1 by the Region of Conversion, an annealing temperature of about 1500° C. requires a pressure of at least about 48 kilobars, at 1600° C. the pressure should be at least about 51 kilobars and preferably about 61 kilobars, at 2000° C. the pressure should be at least about 63 kilobars and preferably about 74 kilobars, and at a temperature of about 2200° C. the pressure should be at least about 70 kilobars and preferably about 80 kilobars.

Annealing time, i.e. the period of time at annealing temperature and pressure, is determinable empirically and can range from about one minute to about 50 hours, and preferably up to about 20 hours. Usually it ranges from about 10 minutes to about 5 hours. Specifically, annealing time depends largely on annealing temperature, the kind of Ib crystal being annealed as determined by its nitrogen content, and the extent or degree of conversion of the type Ib to Ia required. With rising annealing temperatures, the rate of conversion of type Ib to type Ia increases significantly, i.e. more than five times in going from 1600° C. to 2200° C. The mechanism of the present process is not understood but it is believed that the rate of conversion of Ib nitrogen to Ia nitrogen does not differ significantly between a crystal of high nitrogen content and one of low nitrogen content, but the period of annealing time at a given annealing temperature to leave essentially the same amount of type Ib nitrogen in each crystal does differ since the Ib crystal with the higher nitrogen content has more nitrogen to convert to type Ia thereby requiring a longer annealing time.

While the detailed mechanism of the conversion process is not understood, annealing experiments have shown that the activation energy for the process is approximately 83 kilocalories/mole (3.6 eV).

The extent of conversion of a Ib crystal to Ia is determinable empirically by a number of known methods in the art. For example, most of the nitrogen in type Ia crystal is EPR inactive (Electron Paramagnetic Resonance) whereas the dissolved nitrogen in type Ib diamond crystal is EPR active. Also, types Ia and Ib crystals each have typical infrared, visible and ultraviolet spectra with characteristic features which are identifiable in infrared, visible and ultraviolet spectra of a crystal of mixed type Ia and Ib.

Preferably, to determine satisfactory annealing times and temperatures for a particular kind of type Ib crystal, e.g., a crystal containing a certain amount of dissolved nitrogen as reflected by its infrared, visible and ultraviolet spectra and the intensity of its color, the type Ib crystal should preferably be initially produced in the form of a platelet polished on both sides so that the spectra taken thereof are well-defined. The platelet is then annealed at a given annealing temperature for a certain period of time and after each annealing run, its infrared, visible and ultraviolet spectra are taken. A comparison of spectra taken before and after annealing indicates the extent of conversion to type Ia. Also, additional comparisons of such spectra with EPR spectra of the type Ib crystal before and after annealing are another indication of the extent of conversion to type Ia. Once the time for annealing this particular kind of type Ib crystal has been determined to attain a certain conversion to type Ia, such annealing time and annealing temperature can be used for the same kind of Ib crystal, e.g. a crystal containing substantially the same amount of dissolved nitrogen, regardless of its size or shape, to attain the same or substantially the same degree of conversion to type Ia.

Also, after the reaction rates are determined by experiments on a particular kind of Ib crystal, it is possible to estimate the correct annealing times which would leave a specified amount of type Ib nitrogen in the crystal for type Ib crystals having a wide range of nitrogen concentrations initially.

In the present process from at least about 20% up to about 100% of the total amount of type Ib nitrogen present in the crystal is converted to type Ia nitrogen. However, regardless of annealing conditions a residue of type Ib nitrogen in an amount of less than 1% of the total nitrogen present in the crystal will always remain in the crystal and such type Ib nitrogen residue can be as low as 0.001%, or lower, of the total amount of nitrogen present in the crystal. Initial conversion to type Ia nitrogen lower than 20% of the total amount of type Ib nitrogen present in the crystal may not effect the physical properties of the crystal significantly for most applications. The extent or degree of conversion of type Ib nitrogen to type Ia nitrogen depends largely on the particular properties desired. In the annealed crystal produced by the present process which contains both types Ia and Ib, type Ia appears to be uniformly distributed throughout type Ib.

As a result of the present process, at least a portion of the synthetic type Ib crystal undergoes some change in color or shade, i.e. in a greenish-yellow crystal at least a portion changes toward the yellow or for a yellow crystal a portion becomes at least a shade lighter yellow, the extent of which depends on the extent of its conversion to type Ia. Also, when substantially all or all of the type Ib nitrogen is converted to type Ia nitrogen, the result is a very pale yellow and/or a colorless crystal which has many uses as jewelry, and which frequently is of gem quality.

The annealed diamond crystals produced by the present process are useful as abrasives. The abrasive industry requires numerous types of abrasive materials to carry out various grinding or machining operations, the requirements of which are determined largely by the properties of the material being machined and, to some extent, the results desired. For certain operations in the abrasive industry, synthetic type Ib crystal has been satisfactory and for other operations natural type Ia crystal has been satisfactory. However, as a result of the present invention, the abrasive industry now has available a crystal which is a mixture of types Ib and Ia, the composition of which can be controlled to produce crystals with graded physical properties over a wide range to adjust the crystal to the particular abrasive use to which it is applied. Specifically, with increasing degrees of conversion of type Ib to type Ia, the crystal changes in abrasive properties, usually becoming harder and stronger. As a result, a mixed type Ib-Ia crystal can be produced having optimum properties for a particular abrasive use.

When substantially all or all of the type Ib nitrogen in the crystal is converted in the present process, the resulting synthetic type Ia crystal is also highly useful as an abrasive. Since it retains the morphology of the type Ib crystal from which it was produced, it is a type Ia crystal with a morphology ot found in nature.

The annealed diamond crystals of the present process are also useful as jewelry, especially those of gem quality.

The morphology of the as-grown synthetic type Ib diamond crystal is retained in the present process whether they be regular octahedral, cubo-octahedral or those shapeless forms which are specifically grown for abrasive wheel use. The latter type crystals are never found in nature. However, the preferred as-grown type Ib crystal has a cubo-octahedral morphology which is particularly useful in diamond saws. Also, the as-grown type Ib crystal may have an octahedral morphology.

In such instance where the present annealed crystal, polished or unpolished, has a shape which does not reveal it to be synthetic, it can be identified as a synthetic type Ia containing crystal by a known light scattering technique. Specifically, this techique comprises examining the crystal under a microscope by shining a beam of light at an angle thereon and observing the scattered light reflected from scattering centers normally present in synthetic diamond, but such scattering centers, and resulting scattered light, are not known to have been seen in natural type Ia diamond crystal.

The invention is further illustrated by the following examples which are tabulated in Table I and wherein the procedure was as follows unless otherwise stated:

Type Ib synthetic diamond crystals were prepared in a high pressure-high temperature apparatus of the "belt-type" disclosed in U.S. Pat. No. 2,941,248—Hall.

In each example the type Ib diamond crystal was at least partly polished in a conventional manner using a scaife. The resulting plate had a significantly uniform thickness which ranged from about ½ mm to about 1 mm. The size of the plate given in Table I is its maximum width.

Each type Ib diamond crystal was annealed in a reaction vessel as shown in FIG. 2. Graphite rods 6 and 7 were of spectroscopic purity and of the same size, each was 80 mils in diameter and 225 mils in length. A hole 8 was drilled in rod 6 to a size to fit closely around around the particular diamond being annealed and any space between the diamond crystal and inner surface of hole 8 was filled with graphite powder of spectroscopic purity. In all of the examples the diamond crystal did not protrude from the drilled hole 8 and electrical contact between rods 6 and 7 was maintained as shown in FIG. 2. Ceramic cylinder 4 was made of alumina and had an inner diameter of about 80 mils and a wall thickness of 60 mils. Cylinder 3 was made of pyrophyllite and had an inner diameter of about 200 mils and a wall thickness of 75 mils. Metallic disc members 1 and 2 were circular, of the same size, each with a diameter of 350 mils and a thickness of 10 mils, and made of tantalum. The discs were in electrical contact with rods 6 and 7 as shown in FIG. 2. To carry out the present annealing process, this reaction vessel was used in the "belt-type" apparatus disclosed in U.S. Pat. No. 2,941,248—Hall.

Absorption spectra ranging from the ultraviolet through the infrared were made of the diamond crystals at room temperature before and after they were annealed.

Electron paramagnetic resonance (EPR) spectra were made of the diamond crystals at room temperature before and after the crystals were annealed.

With respect to infrared spectra measurements, although the 1130 cm$^{-1}$ band in type Ib crystals is normally used to characterize the Ib crystal, in the present instance, for purposes of accuracy, the 1345 cm$^{-1}$ band which is correlated to type Ib nitrogen was used to determine the conversion of the type Ib nitrogen to type Ia nitrogen.

TABLE I

| Ex. No. | Size (mm) | ANNEALING CONDITION | | | EVIDENCE FOR CONVERSION TO TYPE Ia | | | | | APPEARANCE OF CRYSTAL |
|---|---|---|---|---|---|---|---|---|---|---|
| | | | | | INFRARED | | E P R | | | |
| | | | | | Absorption | Total % | | Total % | VISIBLE-UV | |
| | | Treatment | Temperature (°C.) | Pressure (Kilobars) | Time (Min) | Intensity At 1343 cm$^{-1}$ (cm$^{-1}$) | Converted to Ia | Intensity | Converted to Ia | Transmission at 4500 A | |
| 1 | 1.0 | None | — | — | — | 7.3 | — | 180 | — | Low | Yellow |
| 1A | | Annealed | 1900 | 60 | 30 | 2.55 | 65 | 70 | 61 | Significantly higher than non-annealed Ex.1 | Lighter Yellow than Ex. 1 |
| 2 | 1.5 | None | — | — | — | 5.77 | — | 147 | — | Low | Yellow |
| 2A | | Annealed | 1630 | 61 | 120 | 4.35 | 25 | 114 | 22 | Significantly higher than non-annealed Ex.2 | Lighter Yellow than Ex. 2 |

Table I illustrates the present invention. The decrease in EPR and infrared intensities in the type Ib diamonds of Table I was used to monitor the conversion of type Ib nitrogen to type Ia nitrogen. The alternatives that a decrease in these type Ib diamond EPR and infrared intensities could also occur if the Ib nitrogen was diffusing out of the crystal with no conversion to type Ia nitrogen or changing to nitrogen of yet another type were ruled out for two reasons. The first reason is qualitative in that type Ia infrared absorption bands do appear, hence there is some conversion to type Ia nitrogen. The second reason is quantitative in that from the type Ib and/or type Ia absorption bands present one can calculate, based on published data, using standard techniques, the total amount of nitrogen present. For the present annealing experiments this nitrogen content of any one diamond remains constant, within experimental error. For instance, Example 1 had an initial content of only type Ib nitrogen of 365 ppm. After the annealing treatment, the infrared absorption spectra and EPR for Examples 1 and 1A showed that the type Ib nitrogen decreased to 35 percent and 39 percent, respectively, of its original content as shown in Table I, yet the total nitrogen was 364 ppm, the same as before the annealing process. Hence, no change occurred in the total nitrogen content despite the fact that the final type Ib nitrogen was approximately 35 to 39 percent of that originally present.

Therefore, the change in intensity of the type Ib absorption band at 1343 cm$^{-1}$ is a good indication that type Ib nitrogen is being converted to type Ia nitrogen and is not diffusing out of the diamond or being converted to nitrogen of yet another type.

It is understood that the present annealing process can be carried out with the same diamond crystal more than one time to additionally increase the amount of type Ia nitrogen therein. For example, a mixed type Ib-Ia annealed diamond crystal produced by the present process can be annealed in accordance with the present process to convert an additional amount of type Ib nitrogen to type Ia nitrogen.

In copending U.S. Pat. Application Ser. No. 856,905 filed Dec. 2, 1977, now U.S. Pat. No. 4,124,690, which is a continuation of application Ser. No. 707,299 filed July 21, 1976, now abandoned, which by reference is made part of a disclosure of the present application, there is disclosed the annealing of type Ib or mixed type Ib-Ia natural diamond crystal at an annealing temperature ranging from about 1500° C. to about 2200° C. under a pressure which prevents significant graphitization of the diamond during the annealing to convert at least about 20% of the total amount of type Ib nitrogen present in the crystal to type Ia nitrogen.

What is claimed is:

1. An annealing process for converting type Ib nitrogen in synthetic diamond crystal to type Ia nitrogen, said crystal having a minimum size of one micron as measured along the longest edge dimension of the crystal which consists essentially of subjecting said synthetic diamond crystal to an annealing temperature ranging from about 1500° C. to about 2200° C. under at least a pressure which prevents significant graphitization of said crystal at said annealing temperature for a period of time ranging from about one minute to about 50 hours and sufficient to convert at least about 20% of the total amount of type Ib nitrogen present in said crystal to type Ia nitrogen, the minimum pressure ranging from 48 kilobars at said annealing temperature of 1500° C. to a minimum pressure of 70 kilobars at said annealing temperature of 2200° C., and recovering the resulting annealed free synthetic diamond crystal wherein the dissolved nitrogen detectable by ultraviolet, visible and infrared absorption spectra and electron paramagnetic resonance consists of types Ib and Ia nitrogen, said type Ib nitrogen always being present in said annealed crystal in at least a detectable amount, said annealing process making no significant change in the morphology and physical dimensions of said synthetic diamond crystal.

2. An annealing process according to claim 1 wherein said annealing temperature ranges from about 1600° C. to about 2000° C., and said minimum pressure ranges from 51 kilobars at 1600° C. to a minimum pressure of 63 kilobars at 2000° C.

3. An annealing process according to claim 2 wherein said annealing temperature is about 1900° C.

4. An annealing process according to claim 1 wherein at least about 50% of the total amount of type Ib nitrogen present in the crystal is converted to type Ia nitrogen.

5. An annealing process according to claim 1 wherein the resulting annealed crystal is mixed type Ib-Ia which is further annealed in accordance with the process of claim 1 to convert an additional amount of type Ib nitrogen to type Ia nitrogen.

6. A free annealed synthetically grown diamond crystal wherein the morphology of said crystal is substantially as-synthetically grown, said as-synthetically grown morphology consisting essentially of sharp edges and flat faces, said crystal having nitrogen dissolved therein detectable by ultraviolet, visible and infrared absorption spectra and electron paramagnetic resonance which consists of types Ia and Ib with said type Ib nitrogen always being present in said crystal in at least a detectable amount, and wherein at least about 20% of the total amount of said detectable nitrogen present in the crystal is type Ia, said crystal having a minimum size as measured along the longest edge dimension of the crystal of one micron, said free annealed synthetically grown diamond crystal being produced by the process of claim 1 or claim 5.

7. An annealed synthetically grown diamond crystal according to claim 6 wherein at least about 50% of the total amount of said detectable nitrogen present in the crystal is type Ia.

8. An annealed synthetically grown diamond crystal according to claim 6 wherein more than 99% of the total amount of said detectable nitrogen present in the crystal is type Ia.

9. An annealed synthetically grown diamond crystal according to claim 6 wherein said crystal has an octahedral morphology.

10. An annealed synthetically grown diamond crystal according to claim 6 wherein said crystal has a cubo-octahedral morphology.

11. A free annealed synthetically grown diamond crystal wherein the nitrogen dissolved therein detectable by ultraviolet, visible and infrared absorption spectra and electron paramagnetic resonance consists of type Ia nitrogen and type Ib nitrogen with said type Ib nitrogen always being present in said crystal in at least a detectable amount, said type Ia nitrogen being present in an amount of at least 20% of the total amount of said detectable nitrogen present in the crystal, said crystal having a minimum size as measured along the longest edge dimension of the crystal of 0.25 millimeter, said crystal under a microscope showing scattered light reflected from scattering centers therein when a beam of light is shined at an angle thereon, said reflected scattered light and scattering centers not being shown by natural type Ia diamond, said reflected scattered light characterizing said crystal as synthetically grown, said free annealed synthetically grown diamond crystal being produced by the process of claim 1 or claim 5.

12. A free annealed synthetically grown diamond crystal having nitrogen dissolved therein detectable by ultraviolet, visible and infrared absorption spectra and electron paramagnetic resonance, said dissolved nitrogen consisting of types Ia and Ib with said type Ib nitrogen always being present in said crystal in at least a detectable amount, and wherein at least about 20% of the total amount of said detectable nitrogen present in the crystal is type Ia, said synthetically grown crystal containing an inclusion of a diamond growing metal catalyst, said crystal having a minimum size as measured along the longest edge dimension of the crystal of 1 micron, said free annealed synthetically grown diamond crystal being produced by the process of claim 1 or claim 5.

* * * * *